(12) United States Patent
Ding et al.

(10) Patent No.: US 8,435,419 B2
(45) Date of Patent: May 7, 2013

(54) METHODS OF PROCESSING SUBSTRATES HAVING METAL MATERIALS

(75) Inventors: Guowen Ding, San Jose, CA (US);
Herrick Ng, Cupertino, CA (US);
Teh-Tien Sue, Milpitas, CA (US);
Benjamin Schwarz, San Jose, CA (US);
Zhuang Li, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 146 days.

(21) Appl. No.: 13/014,813

(22) Filed: Jan. 27, 2011

(65) Prior Publication Data

US 2011/0306215 A1 Dec. 15, 2011

Related U.S. Application Data

(60) Provisional application No. 61/354,505, filed on Jun. 14, 2010.

(51) Int. Cl.
*C23F 1/00* (2006.01)

(52) U.S. Cl.
USPC ............ 216/75; 216/67; 216/72; 216/74; 438/706; 438/710; 438/712; 438/714; 438/717; 438/736

(58) Field of Classification Search .............. None
See application file for complete search history.

(56) References Cited

U.S. PATENT DOCUMENTS

| | | | |
|---|---|---|---|
| 2003/0100190 A1* | 5/2003 | Cote et al. | 438/710 |
| 2004/0229470 A1* | 11/2004 | Rui et al. | 438/710 |
| 2010/0326954 A1* | 12/2010 | Zhuo et al. | 216/24 |

OTHER PUBLICATIONS

U.S. Appl. No. 12/884,609, filed Sep. 17, 2010, Ching et al.
U.S. Appl. No. 12/884,620, filed Sep. 17, 2010, Tang et al.
U.S. Appl. No. 12/896,389, filed Oct. 1, 2010, Zhou et al.

* cited by examiner

*Primary Examiner* — Lan Vinh
*Assistant Examiner* — Jiong-Ping Lu
(74) *Attorney, Agent, or Firm* — Moser Taboada; Alan Taboada (57) ABSTRACT

Methods of processing substrates having metal layers are provided herein. In some embodiments, a method of processing a substrate comprising a metal layer having a patterned mask layer disposed above the metal layer, the method may include etching the metal layer through the patterned mask layer; and removing the patterned mask layer using a first plasma formed from a first process gas comprising oxygen ($O_2$) and a carbohydrate. In some embodiments, a two step method with an additional second process gas comprising chlorine ($Cl_2$) or a sulfur (S) containing gas, may provide an efficient way to remove patterned mask residue.

18 Claims, 6 Drawing Sheets

METHODS OF PROCESSING SUBSTRATES HAVING METAL MATERIALS

CROSS-REFERENCE TO RELATED APPLICATIONS

This application claims benefit of U.S. provisional patent application Ser. No. 61/354,505, filed Jun. 14, 2010, which is herein incorporated by reference.

FIELD

Embodiments of the present invention generally relate to semiconductor processing and, more particularly, to methods for processing substrates having metal materials.

BACKGROUND

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

Conventional substrate fabrication utilizes a multi-step processing technique, which includes multiple etching steps performed in different process chambers. For example, multiple layers including a photoresist and one or more antireflective layers (e.g., a bottom antireflective coating, a tri-layer resist, or the like) may be formed atop one or more layers of the substrate and successively etched. Following the etch processes a post-etch stripping process is performed to remove the photoresist, antireflective materials and any residue thereof. However, conventional post etch stripping processes are time consuming and inefficient. For example, in some instances, where no or low bias power is provided, the removal rate may undesirably lessen, and the process may fail to completely remove the residual materials. Alternatively, in some instances where high bias power is provided, undesirable etching of underlying layers (e.g., metal layers) may occur. As such, the inventors have provided a new process that provides excellent photoresist to metal layer selectivity, allowing for rapid processing without undesired etching of the metal material.

SUMMARY

Methods of processing substrates having metal layers are provided herein. In some embodiments, a method of processing a substrate comprising a metal layer having a patterned mask layer disposed above the metal layer, the method may include etching the metal layer through the patterned mask layer; and removing the patterned mask layer using a first plasma formed from a first process gas comprising oxygen ($O_2$) and a carbohydrate. In some embodiments, a two step method with an additional second process gas comprising chlorine ($Cl_2$) or a sulfur (S) containing gas, may provide an efficient way to remove patterned mask residue.

Other embodiments are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only exemplary embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to methods for processing substrates having metal materials, and specifically, the removal of etch residue and photoresist materials from substrate surfaces post etch processes. The inventive methods provided herein may further advantageously provide a faster removal of etch residue and excess photoresist material over conventional etch techniques and facilitate improved control over the critical dimension of etched features.

Figure 1:
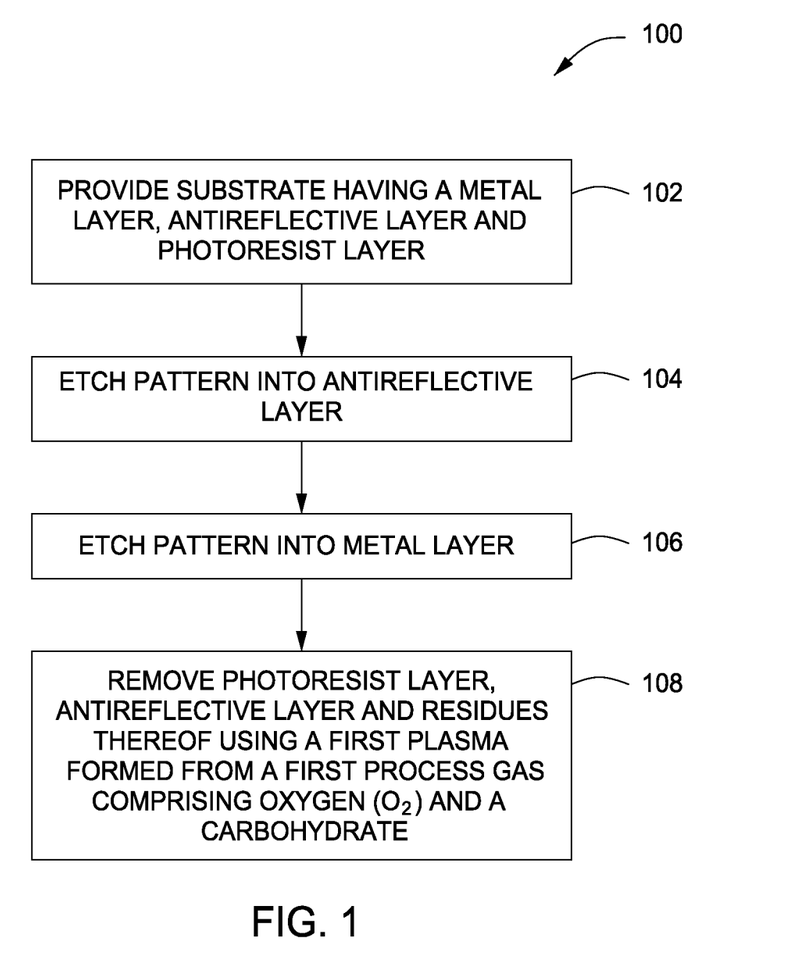
FIG. 1 depicts a method for the processing of a semiconductor substrate in accordance with some embodiments of the present invention.

FIG. 1 depicts a method for the processing of a substrate having metal materials in accordance with some embodiments of the present invention. The method 100 described herein may advantageously be performed in a single processing chamber, such as described below with respect to FIG. 3. The individual processes described in the method 100 could also be performed in separate process chambers, if desired. FIGS. 2A-2D are illustrative cross-sectional views of a substrate having metal materials disposed thereon during different stages of the process sequence in accordance with some embodiments of the present invention. To best understand the invention, the reader should refer simultaneously to FIG. 1 and FIGS. 2A-2D.

Figure 2A:
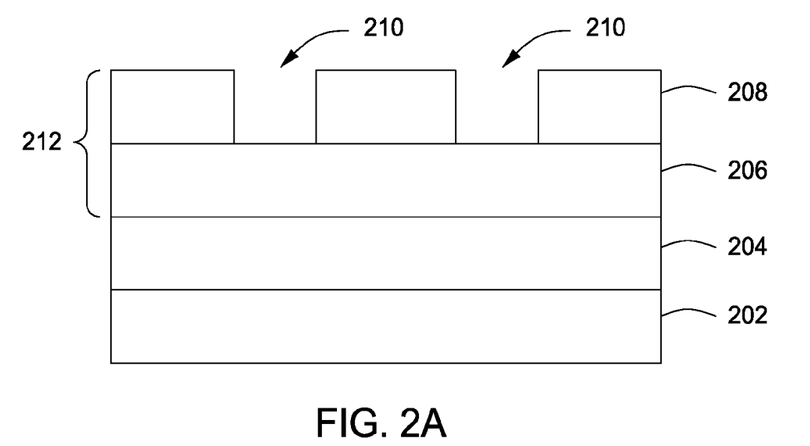
FIGS. 2A-2D are illustrative cross-sectional views of a substrate during different stages of the processing sequence in accordance with some embodiments of the present invention.
Figure 2B:
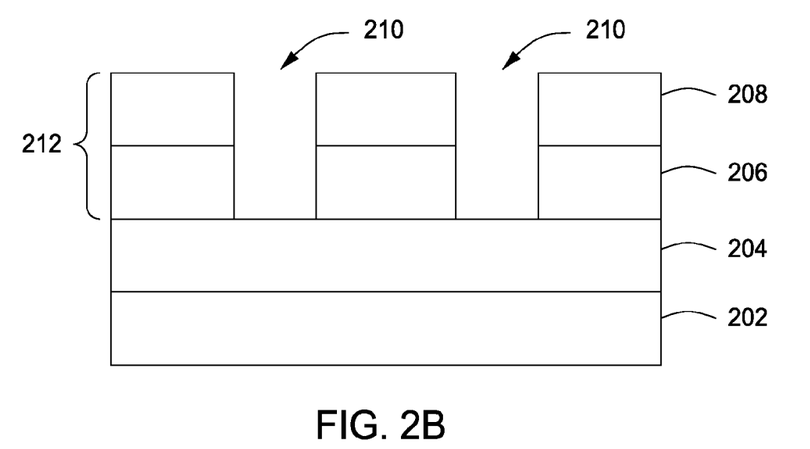
Figure 2C:
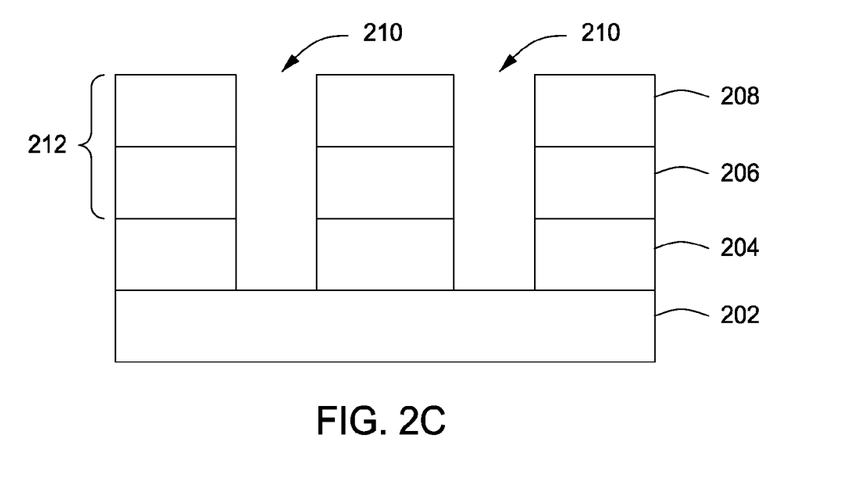

The method 100 generally begins at 102, where a metal layer 204 having a patterned mask layer 212 disposed thereon is provided, as depicted in FIG. 2A. The patterned mask layer 212 may be a single layer, or in some embodiments, may comprise more than one layer. For example, in some embodiments, the patterned mask layer 212 may comprise an antireflective layer 206 and a photoresist layer 208, such as depicted in FIG. 2A. In some embodiments, additional layers, for example additional antireflective layers, may be present. For example, in such embodiments, in addition to the antireflective layer 206 and the photoresist layer 208 a second antireflective layer (not shown) may be present to form a tri-layer resist. When present, the photoresist layer 208 may be patterned to have openings 210 in a desired geometry, as depicted in FIGS. 2A-C. In some embodiments, the metal layer 204 may be disposed atop a substrate 202.

The substrate 202 may be any suitable substrate, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 202 may be a semiconductor wafer (e.g., a 200 mm, 300 mm, or the like silicon wafer). In some embodiments, the substrate 202 may include additional layers, for example a dielectric layer. In some embodiments, the substrate may be a partially fabricated semiconductor device such as Logic, DRAM, or a Flash memory device. In addition, features, such as trenches, vias, or the like, may be formed in one or more layers of the substrate 202.

The metal layer 204 may comprise any metal material suitable to be used in substrate or semiconductor fabrication. The metal layer 204 may comprise a metal or semi-metal. For example, the metal layer 204 may comprise titanium (Ti), tantalum (Ta), aluminum (Al), tungsten (W), copper (Cu), chromium (Cr), gold (Au), or the like, or a metal nitride, for example, such as titanium nitride (TiN), tantalum nitride (TaN), tungsten nitride (WN), boron nitride (BN), or a metal-containing dielectric material, for example a high-K dielectric material (e.g. wherein K is greater than 3.9), or an alloy, such as germanium-antimony-tellurium (GeSbTe). In some embodiments, the metal layer 204 may be a hard mask layer used to facilitate etching a pattern or feature into a substrate 202. For example, in such embodiments, the hard mask layer comprises titanium nitride (TiN). The metal layer 204 may be formed over the substrate 202 in any suitable manner, such as by chemical vapor deposition (CVD), physical vapor deposition (PVD), or the like.

In addition, in some embodiments, the metal layer 204 may be a hard mask comprising at least one of a silicon oxide, such as silicon dioxide ($SiO_2$), silicon oxynitride (SiON), or the like, or a metal or semi-metal nitride, such as titanium nitride (TiN), silicon nitride (SiN), or the like, silicides, such as titanium silicide (TiSi), nickel silicide (NiSi) or the like, or silicates, such as aluminum silicate (AlSiO), zirconium silicate (ZrSiO), hafnium silicate (HfSiO), or the like. In some embodiments, other layers may be disposed on the substrate to be etched. For example, the other layers may comprise conductive materials, dielectric materials, or the like.

The photoresist layer 208 may comprise any suitable photoresist, such as a positive or negative photoresist that may be formed and patterned in any suitable manner as known in the art. The antireflective layer 206 is provided to facilitate improved control over the patterning of the photoresist layer 208. In some embodiments, for example where a tri-layer resist is present, the first antireflective layer 206 may be disposed beneath the photoresist layer 208, and a second antireflective layer (not shown) may be disposed beneath the first antireflective layer 206. In such embodiments, the antireflective layers may comprise any materials suitable to provide an adequate amount of control over the subsequent patterning processes and may be formed in any suitable manner as known in the art.

In some embodiments, the antireflective layer 206 may be fabricated from an organic material. For example, the antireflective layer 206 may comprise organic materials such as polyamides, polysulfones, and the like. In embodiments where the second antireflective layer is present, the second antireflective layer may comprise any suitable antireflective materials, such as a silicon-based material, for example, silicon nitride (SiN), silicon oxynitride (SiON), silicon carbide (SiC), and the like.

Although the above embodiments are described with respect to a metal layer 204 having an antireflective layer 206 and photoresist layer 208, or a tri-layer resist disposed thereon, the inventors have observed that any materials suitable to provide an etch template for etching the metal layer 204 may be utilized in the inventive methods. For example, the antireflective layer 206 or tri-layer resist may be replaced two or more layers of any suitable material such as a positive or negative photoresist, organic materials (i.e., polyamides, polysulfones, or the like), one or more antireflective coatings (ARC) (i.e., a Si-rich antireflective coating (ARC) layer, a carbon-rich ARC, a bottom ARC (BARC), a dielectric antireflective coating (DARC), or the like), or an amorphous carbon, such as Advanced Patterning Film (APF), available from Applied Materials, Inc., located in Santa Clara, Calif.

Next, at 104, the antireflective layer 206 may be etched through the photoresist layer 208 to extend the openings 210 of the photoresist layer 208 to the antireflective layer 208, as depicted in FIG. 2B. The antireflective layer 206 may be etched using a plasma formed from a process gas, as described below. In some embodiments, the antireflective layer 206 may be etched using the plasma formed from the process gas comprising chlorine ($Cl_2$) or fluorine (F) (e.g., such as carbon tetrafluoride ($CF_4$), trifluoromethane ($CHF_3$), nitrogen trifluoride ($NF_3$), sulfur hexafluoride ($SF_6$), or the like) as the primary reactive agent. In some embodiments, the process gas may comprise chlorine ($Cl_2$) and ethylene ($C_2H_4$) as the primary reactive agents. The use of chlorine ($Cl_2$) or fluorine (F) as a primary reactive agent may facilitate an increased etching rate. In addition, the features etched may advantageously comprise a tapered profile, thereby desirably providing a feature having a reduced critical dimension. In some embodiments, the process gas may additionally comprise one or more additives to promote plasma stability, for example, at least one of, oxygen ($O_2$), or hydrogen ($H_2$). In addition, the process gas may further comprise an inert gas as a dilutant or carrier gas, such as one or more of nitrogen ($N_2$), helium (He), argon (Ar), or the like.

In some embodiments, for example where more than one antireflective layer is present (e.g., a tri-layer resist as discussed above), the additional antireflective layers may also be etched to extend the openings 210 of the photoresist layer 208 and the antireflective layer 206 to the additional antireflective layer. In such embodiments, the additional antireflective layers may be etched using the same, or in some embodiments, different, plasma compositions as described above. For example, in some embodiments, the additional antireflective layer may be etched using a plasma formed from a second process gas comprising oxygen ($O_2$) and, optionally, ethylene ($C_2H_4$), Chlorine ($Cl_2$) as the primary reactive agent(s). In addition, the second process gas may further comprise an inert gas as a dilutant or carrier gas, such as nitrogen ($N_2$), helium (He), argon (Ar), or the like.

Next, at 106, the metal layer 204 may then be etched to transfer the pattern or feature to the metal layer 204, thereby defining a metal layer 204 having the pattern or feature defined therein, as shown in FIG. 2C. For example, in some embodiments, the pattern or feature may be etched into the metal layer 204 by exposing the metal layer 204 to a plasma formed from a process gas comprising chlorine ($Cl_2$) and ethylene ($C_2H_4$). In addition, the process gas may further comprise an inert gas as a carrier gas, such as nitrogen ($N_2$), helium (He), argon (Ar), or the like.

Figure 2D:
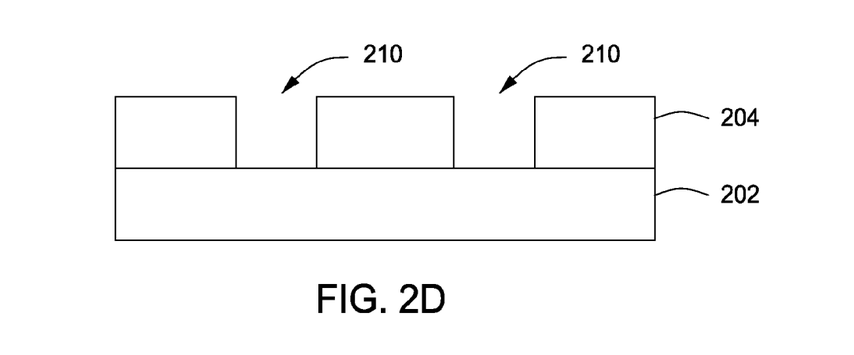

Next, at 108, the remaining antireflective layer 206, photoresist 208, and any residue thereof deposited upon the substrate or chamber components, may be removed as shown in FIG. 2D.

In some applications, the inventors have observed several problems that may arise when removing photoresist (or a antireflective layer, such as the antireflective layer 206) disposed over a metal layer with conventionally used plasma processes. In some instances, where no or low bias power is provided, the removal rate may undesirably lessen, and the process may fail to completely remove the residual materials. On the other hand, in some instances where high bias power is provided, undesirable etching of the metal hard mask layer may occur. As such, the inventors have provided a new process that provides excellent photoresist to metal hard mask selectivity, allowing for rapid processing without undesired etching of the metal hard mask material.

Accordingly, in some embodiments, the remaining antireflective layer 206 and photoresist 208 may be removed at 108 by exposing the substrate 202 to a plasma formed from a process gas comprising oxygen ($O_2$) and a carbohydrate. In some embodiments, the carbohydrate comprises ethylene ($C_2H_4$). The inclusion of $C_2H_4$ in the plasma may advantageously allow for a high bias power to be provided, which may increase the rate of etch and residue removal without damaging (e.g., substantially without etching) the metal materials. The inclusion of $C_2H_4$ may further advantageously provide a higher etch selectivity between the etch residue and the underlying metal layer 204, thereby facilitating antireflective layer 206 and photoresist 208 residue removal without undesirably etching the underlying metal layer 204, thus providing greater control over the critical dimension of the openings 210. In addition, the process gas may further comprise an inert gas as a carrier gas, such as nitrogen ($N_2$), helium (He), argon (Ar), or the like.

The process gas may be provided to the process chamber via a gas source coupled to the process chamber at a total flow rate of about 10 to about 1000 sccm, or about 300 sccm. In some embodiments, the flow rate ratio of oxygen ($O_2$) to carbohydrate (e.g., ethylene ($C_2H_4$)) may be about 1000:1 to about 1:1, or about 10:1. In some embodiments, the amount of the carbohydrate in the process gas may be adjusted to control the critical dimension of the features formed by the openings 110 patterned mask layer 212. In embodiments where the reactive gases are provided with one or more inert gases, a flow rate ratio of reactive gases to inert gases may be about 10:1 to about 1:10, or about 1:1.

The process gas may be formed into a plasma by coupling RF power at a suitable frequency to the process gas mixture within a process chamber under suitable conditions to establish and maintain the plasma, such as described below with respect to FIG. 3. For example, in some embodiments, a plasma power source of up to about 3000 W, or about 300 to about 2000 W, or about 1000 W, at a frequency in a range from 50 kHz to 60 MHz may be provided to ignite and maintain the plasma. In some embodiments, a bias power may be applied to the substrate to facilitate directing ions from the plasma towards the substrate, thereby facilitating the etching process. For example, in some embodiments, the bias power may be about 50 to about 1000 W, at a frequency in a range from 50 kHz to 60 MHz.

Additional process parameters may be utilized to promote plasma ignition and stability. For example, in some embodiments, the process chamber may be maintained at a temperature of about 0 to about 300 degrees Celsius during plasma ignition and etching. Additionally, in some embodiments, the process chamber may be maintained at a pressure of about 3 to about 100 mTorr, such as about 8 mTorr.

In post-strip metal material applications, the inventors have observed the efficiency and process time of the etch residue and material removal at 108 may be improved via a two step process. Accordingly, in some embodiments, prior to exposing the substrate 202 to the plasma, etch residue may be removed from the substrate 202 by exposing the substrate 202 to a second plasma formed from a second process gas comprising oxygen and a carbohydrate in addition to one of a sulfur containing gas, such as sulfur oxide ($SO_2$), or a chlorine containing gas. For example, in some embodiments, a first portion of the patterned mask layer may be removed using a second plasma formed from a second process gas comprising oxygen ($O_2$) and a carbohydrate and one of a chlorine ($Cl_2$) containing gas or sulfur (S) containing gas, and a remaining portion of the patterned mask layer may be removed using the first plasma formed from the first process gas.

The second process gas may be provided to the process chamber via a gas source coupled to the process chamber at a total flow rate of about 10 to about 1000 sccm, or about 300 sccm. In embodiments where the second process gas comprises oxygen, a carbohydrate (e.g., ethylene ($C_2H_4$)) and a sulfur containing gas, the flow rate ratio of oxygen to carbohydrate to sulfur containing gas may be about 1:0.001:0.1 to about 1:1:10, or about 1:0.1:1. In embodiments where the second process gas comprises oxygen, a carbohydrate and a chlorine containing gas, the flow rate ratio of oxygen to carbohydrate to chlorine containing gas may be about 1:0.001:0.01 to about 1:1:10, or about 1:0.1:3. In any of the above embodiments, the amount of the carbohydrate in the second process gas may be adjusted to control the critical dimension of the features formed by the openings 210 of the patterned mask layer 212. In embodiments where the reactive gases are provided with one or more inert gases, a flow rate ratio of reactive gases to inert gases may be about 10:1 to about 1:10, or about 1:1.

In some embodiments, the second process gas may be formed into a plasma by coupling RF power at a suitable frequency to the process gas mixture within a process chamber under suitable conditions to establish and maintain the plasma, such as described below with respect to FIG. 3. For example, in some embodiments, a plasma power source of up to about 3000 W, or about 300 to about 2000 W, or about 1000 W, at a frequency in a range from 50 kHz to 60 MHz may be provided to ignite and maintain the plasma. In some embodiments, a bias power may be applied to the substrate to facilitate directing ions from the plasma towards the substrate, thereby facilitating the etching process. For example, in some embodiments, the bias power may be about 50 to about 1000 W, at a frequency in a range from 50 kHz to 60 MHz.

Additional process parameters may be utilized to promote plasma ignition and stability. For example, in some embodiments, the process chamber may be maintained at a temperature of about 0 to about 300 degrees Celsius during plasma ignition and etching. Additionally, in some embodiments, the process chamber may be maintained at a pressure of about 3 to about 100 mTorr, such as about 8 mTorr.

Following the exposure of the substrate 202 to the second plasma, the remaining etch mask material may be stripped using the plasma as described above.

Upon completion of removing the photoresist layer 208, antireflective layer 206 and residue, the method 100 generally ends. The substrate 202 may then continue being processed as desired to complete the devices and/or structures being fabricated on the substrate. Although only a number of openings 210 are depicted in FIGS. 2A-D, the inventive methods are suitable for use in connection with forming any features, for example, single or dual damascene structures, contacts, vias, trenches, or any other feature or pattern as desired.

Figure 5A:
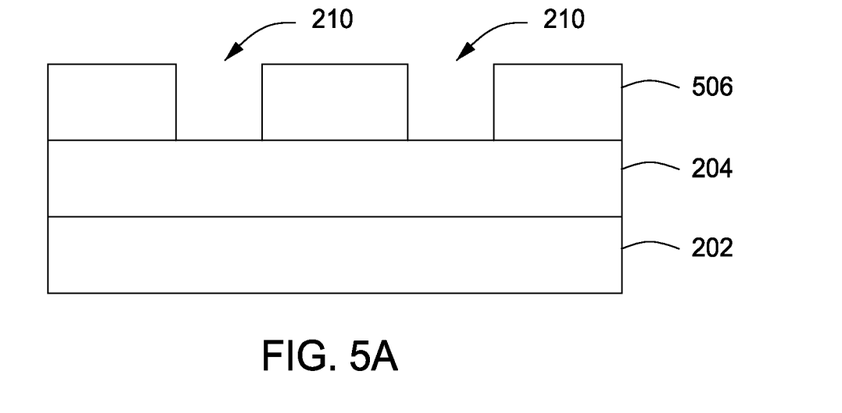
FIGS. 5A-5C are illustrative cross-sectional views of a substrate during different stages of the processing sequence in accordance with some embodiments of the present invention.

Although the above embodiments are described with respect to a metal layer 204 having an photoresist 208 and antireflective layer 206 or a tri-layer resist disposed thereon, the inventors have observed that any materials suitable to provide an etch template for etching the metal layer 204 may be utilized in the inventive methods. For example, in some embodiments, as depicted in FIG. 5, a patterned mask layer 506 may be disposed above the metal layer 204. In such embodiments, the patterned mask layer 506 may comprise any material suitable to provide an etch template. For example, in some embodiments, the patterned mask layer 506 may comprise any of the materials discussed above with respect to the photoresist 208 and antireflective layer 206 or a tri-layer resist of FIG. 1.

Figure 3:
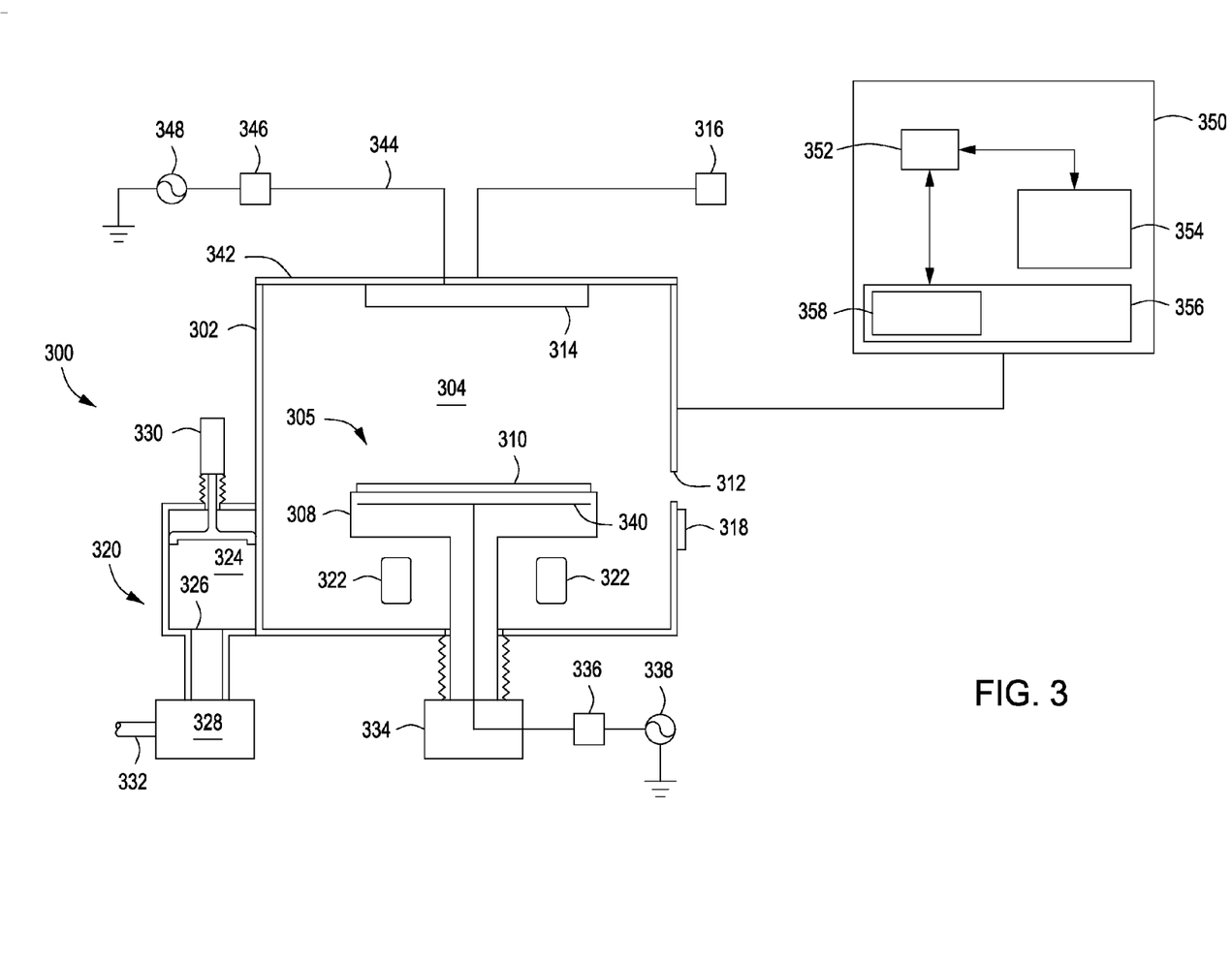
FIG. 3 depicts an apparatus suitable for processing semiconductor substrates in accordance with some embodiments of the present invention.
Figure 4:
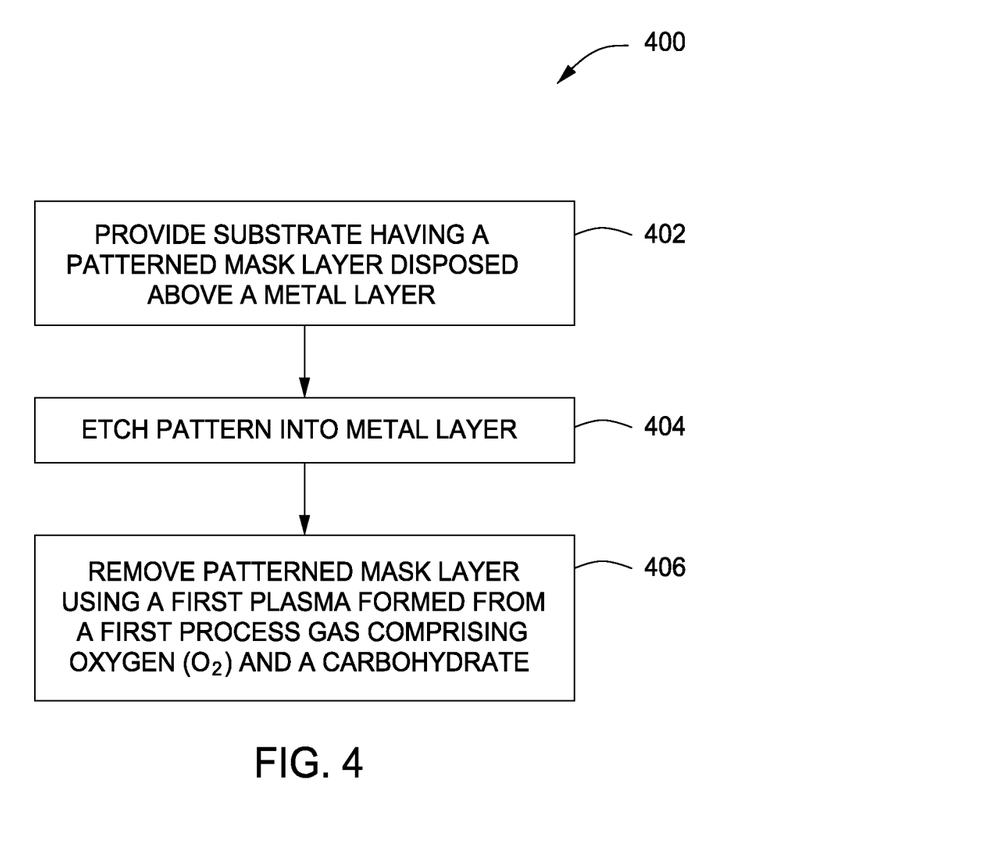
FIG. 4 depicts a method for the processing of a semiconductor substrate in accordance with some embodiments of the present invention.

In such embodiments, the metal layer 204 may be processed by the method 400 as depicted in FIG. 4. The method 400 may be performed in a single processing chamber, such as described below with respect to FIG. 3. The individual processes described in the method 400 could also be performed in separate process chambers, if desired.

The method 400 begins at 402, where a substrate 202 having a patterned mask layer 506 disposed above a metal layer 204 is provided. The substrate 202, patterned mask layer 506 and metal layer 204 may comprise any materials suitable for substrate processing. For example, the substrate 202, patterned mask layer 506 and metal layer 204 may comprise any of the materials discussed above with respect to the substrate 202, patterned mask layer 212 and metal layer 204 of FIG. 2.

Figure 5B:
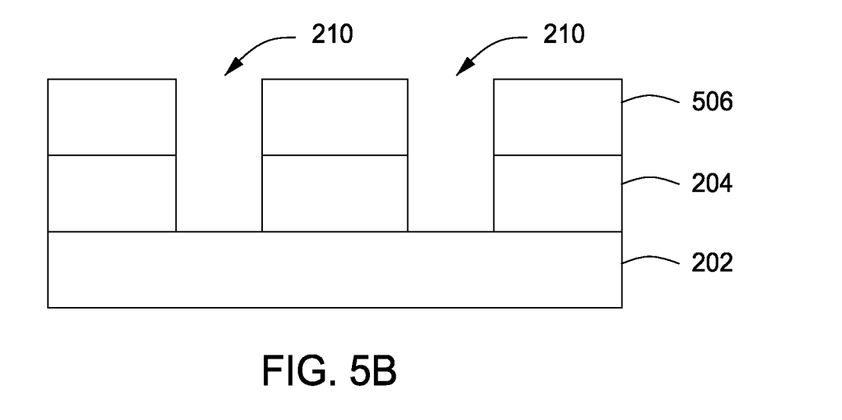

Next, at 404, the metal layer 204 may be etched through the patterned mask layer 506 to extend the openings 210 of the patterned mask layer 506 to the metal layer 204, as depicted in FIG. 5B. The metal layer 204 may be etched using a plasma formed from a process gas, for example such as the plasma described above with respect to etching of the metal layer 204 of FIG. 2.

Figure 5C:
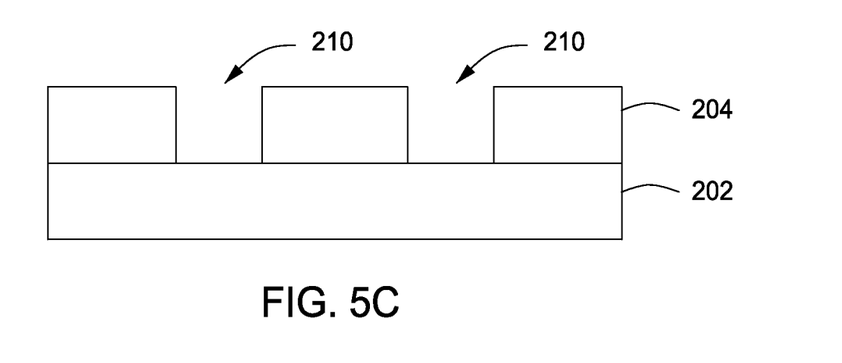

Next, at 406, the remaining patterned mask layer 506, and any residue thereof deposited upon the substrate or chamber components, may be removed as shown in FIG. 5C. The remaining patterned mask layer 506 may be removed by exposing the substrate 202 to a first plasma formed from a process gas comprising oxygen ($O_2$) and a carbohydrate, for example, such as described above with respect to etching the antireflective layer 206 and photoresist 208 of FIG. 2. Alternatively, in some embodiments, the remaining patterned mask layer 506 may be removed using a two step process, for example, as described above.

Upon completion of removing the patterned mask layer 506 and residue, the method 100 generally ends. The substrate 202 may then continue being processed as desired to complete the devices and/or structures being fabricated on the substrate. Although only a number of openings 210 are depicted in FIGS. 5A-C, the inventive methods are suitable for use in connection with forming any features, for example, single or dual damascene structures, contacts, vias, trenches, or any other feature or pattern as desired.

FIG. 3 depicts an apparatus 300 suitable for processing a substrate in accordance with some embodiments of the present invention. The apparatus 300 may comprise a controller 350 and a process chamber 302 having an exhaust system 320 for removing excess process gases, processing by-products, or the like, from the interior of the process chamber 305. Exemplary process chambers may include the DPS®, ENABLER®, ADVANTEDGE™, or other process chambers, available from Applied Materials, Inc. of Santa Clara, Calif. Other suitable process chambers may similarly be used.

The process chamber 302 has an inner volume 305 that may include a processing volume 304. The processing volume 304 may be defined, for example, between a substrate support pedestal 308 disposed within the process chamber 302 for supporting a substrate 310 thereupon during processing and one or more gas inlets, such as a showerhead 314 and/or nozzles provided at desired locations. In some embodiments, the substrate support pedestal 308 may include a mechanism that retains or supports the substrate 310 on the surface of the substrate support pedestal 308, such as an electrostatic chuck, a vacuum chuck, a substrate retaining clamp, or the like (not shown). In some embodiments, the substrate support pedestal 308 may include mechanisms for controlling the substrate temperature (such as heating and/or cooling devices, not shown) and/or for controlling the species flux and/or ion energy proximate the substrate surface.

For example, in some embodiments, the substrate support pedestal 308 may include an RF bias electrode 340. The RF bias electrode 340 may be coupled to one or more bias power sources (one bias power source 338 shown) through one or more respective matching networks (matching network 336 shown). The one or more bias power sources may be capable of producing up to 1200 W at a frequency of about 2 MHz, or about 13.56 MHz, or about 60 Mhz. In some embodiments, two bias power sources may be provided for coupling RF power through respective matching networks to the RF bias electrode 340 at respective frequencies of about 2 MHz and about 13.56 MHz. In some embodiments, three bias power sources may be provided for coupling RF power through respective matching networks to the RF bias electrode 340 at respective frequencies of about 2 MHz, about 13.56 MHz, and about 60 Mhz. The at least one bias power source may provide either continuous or pulsed power. In some embodiments, the bias power source alternatively may be a DC or pulsed DC source.

The substrate 310 may enter the process chamber 302 via an opening 312 in a wall of the process chamber 302. The opening 312 may be selectively sealed via a slit valve 318, or other mechanism for selectively providing access to the interior of the chamber through the opening 312. The substrate support pedestal 308 may be coupled to a lift mechanism 334 that may control the position of the substrate support pedestal 308 between a lower position (as shown) suitable for transferring substrates into and out of the chamber via the opening 312 and a selectable upper position suitable for processing. The process position may be selected to maximize process uniformity for a particular process. When in at least one of the elevated processing positions, the substrate support pedestal 308 may be disposed above the opening 312 to provide a symmetrical processing region.

The one or more gas inlets (e.g., the showerhead 314) may be coupled to a gas supply 316 for providing one or more process gases into the processing volume 304 of the process chamber 302. Although a showerhead 314 is shown in FIG. 3, additional or alternative gas inlets may be provided such as nozzles or inlets disposed in the ceiling or on the sidewalls of the process chamber 302 or at other locations suitable for providing gases as desired to the process chamber 302, such as the base of the process chamber, the periphery of the substrate support pedestal, or the like.

In some embodiments, the apparatus 300 may utilize capacitively coupled RF power for plasma processing, although the apparatus may also or alternatively use inductive coupling of RF power for plasma processing. For example, the process chamber 302 may have a ceiling 342 made from dielectric materials and a showerhead 314 that is at least partially conductive to provide an RF electrode (or a separate RF electrode may be provided). The showerhead 314 (or other RF electrode) may be coupled to one or more RF power sources (one RF power source 348 shown) through one or more respective matching networks (matching network 346 shown) via a conductor 344. The one or more plasma sources may be capable of producing up to about 3,000 W, or in some embodiments, up to about 5,000 W at a frequency of about 2 MHz and or about 13.56 MHz or high frequency, such as 27 MHz and/or 60 MHz. The exhaust system 320 generally includes a pumping plenum 324 and one or more conduits that couple the pumping plenum 324 to the inner volume 305 (and generally, the processing volume 304) of the process chamber 302.

A vacuum pump 328 may be coupled to the pumping plenum 324 via a pumping port 326 for pumping out the exhaust gases from the process chamber 302. The vacuum pump 328 may be fluidly coupled to an exhaust outlet 322 for routing the exhaust as required to appropriate exhaust handling equipment (for example, via a foreline 332). A valve 330 (such as a gate valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the process chamber 302 as described above, the controller 350 may be one of any form of general-purpose computer processor that can be used in an industrial setting for controlling various chambers and sub-processors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The inventive methods disclosed herein may generally be stored in the memory 356 as a software routine 358 that, when executed by the CPU 352, causes the process chamber 302 to perform processes of the present invention. The software routine 358 may also be stored and/or executed by a second CPU (not shown) that is remotely located from the hardware being controlled by the CPU 352. Some or all of the method of the present invention may also be performed in hardware. As such, the invention may be implemented in software and executed using a computer system, in hardware as, e.g., an application specific integrated circuit or other type of hardware implementation, or as a combination of software and hardware. The software routine 358 may be executed after the substrate 310 is positioned on the pedestal 308. The software routine 358, when executed by the CPU 352, transforms the general purpose computer into a specific purpose computer (controller) 350 that controls the chamber operation such that the methods disclosed herein are performed.

While the foregoing is directed to embodiments of the present invention, other and further embodiments of the invention may be devised without departing from the basic scope thereof.

The invention claimed is:

1. A method of processing a substrate comprising a metal layer having a patterned mask layer disposed above the metal layer, the method comprising:

etching the metal layer through the patterned mask layer;
removing a first portion of the patterned mask layer using a second plasma formed from a second process gas comprising oxygen ($O_2$), ethylene ($C_2H_4$), and one of a chlorine ($Cl_2$) containing gas or a sulfur (S) containing gas; and
removing a remaining portion of the patterned mask layer using a first plasma formed from a first process gas comprising oxygen ($O_2$) and ethylene ($C_2H_4$).

2. The method of claim 1, wherein the patterned mask layer comprises a tri-layer resist comprising a first antireflective layer, a second antireflective layer disposed over the first antireflective layer, and a patterned photoresist layer defining a pattern to be etched into the metal hard mask layer.

3. The method of claim 2, wherein the first antireflective layer is an organic antireflective layer.

4. The method of claim 2, wherein the second antireflective layer comprises a silicon-based antireflective layer.

5. The method of claim 1, wherein the patterned mask layer comprises a photoresist.

6. The method of claim 1, wherein the patterned mask layer comprises at least one of a silicon based antireflective layer, a carbon-rich antireflective layer, a bottom antireflective layer, a dielectric antireflective layer, or an amorphous carbon layer.

7. The method of claim 1, wherein the metal layer comprises titanium (Ti), tantalum (Ta), aluminum (Al), tungsten (W), copper (Cu), chromium (Cr), gold (Au), titanium nitride (TiN), tantalum nitride (TaN), tungsten nitride (WN), boron nitride (BN), germanium-antimony-tellurium (GeSbTe), or a metal-containing dielectric material having a dielectric constant greater than about 3.9.

8. The method of claim 1, wherein etching the metal layer through the patterned mask layer comprises:

etching a pattern defined by the patterned mask layer into the metal layer using a plasma formed from a process gas comprising chlorine ($Cl_2$) and ethylene ($C_2H_4$).

9. The method of claim 1, wherein the first process gas is provided at a flow rate of about 10 to about 1000 sccm.

10. The method of claim 1, wherein the first process gas has a flow rate ratio of oxygen ($O_2$) to ethylene ($C_2H_4$) of about 1000:1 to about 1:1.

11. The method of claim 10, wherein the flow rate ratio of oxygen ($O_2$) to ethylene ($C_2H_4$) is adjusted to facilitate control over a critical dimension of features formed by the patterned mask layer.

12. The method of claim 1, wherein forming the first plasma from the first process gas comprises:

applying a plasma power source of up to about 3000 W at a frequency from about 50 kHz to about 60 MHz to ignite the first process gas to form the first plasma.

13. The method of claim 1, wherein the second process gas is provided at a flow rate of about 10 sccm to about 1000 sccm.

14. The method of claim 1, wherein an amount of ethylene ($C_2H_4$) in the second process gas may be adjusted to control a critical dimension of features formed by the patterned mask layer.

15. The method of claim 1, wherein the second process gas comprises either:

oxygen ($O_2$), ethylene ($C_2H_4$), and the sulfur (S) containing gas having a flow rate ratio of oxygen ($O_2$) to ethylene ($C_2H_4$) to the sulfur (S) containing gas of about 1:0.001:0.1 to about 1:1:10; or
oxygen ($O_2$), ethylene ($C_2H_4$), and the chlorine ($Cl_2$) containing gas having a flow rate ratio of oxygen ($O_2$) to ethylene ($C_2H_4$) to the chlorine ($Cl_2$) containing gas to of about 1:0.001:0.01 to about 1:1:10.

16. The method of claim 1, wherein forming the second plasma from the second process gas comprises:

applying a plasma power source of up to about 3000 W at a frequency from about 50 kHz to about 60 MHz to ignite the second process gas to form the second plasma.

17. The method of claim 1, wherein the second process gas further comprises an inert gas.

18. The method of claim 1, wherein the method is performed in a single process chamber.

* * * * *